(12) United States Patent
Choi

(10) Patent No.: US 8,013,323 B2
(45) Date of Patent: *Sep. 6, 2011

(54) NITRIDE SEMICONDUCTOR AND METHOD FOR MANUFACTURING THEREOF

(75) Inventor: Sung Chul Choi, Jeonbuk (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/631,767

(22) Filed: Dec. 4, 2009

(65) Prior Publication Data

US 2010/0078766 A1 Apr. 1, 2010

Related U.S. Application Data

(63) Continuation of application No. 11/542,940, filed on Oct. 5, 2006, now Pat. No. 7,834,343.

(30) Foreign Application Priority Data

Oct. 6, 2005 (KR) ........................ 10-2005-0093778

(51) Int. Cl.
*H01L 31/00* (2006.01)
*H01L 29/15* (2006.01)

(52) U.S. Cl. ................ 257/13; 257/77; 257/78; 257/79; 257/103; 257/E21.108; 257/E29.089; 257/E33.032

(58) Field of Classification Search ................... 257/77, 257/78, 98, 99, 103, E21.108, E29.089, E33.032, 257/13, 79
See application file for complete search history.

(56) References Cited

U.S. PATENT DOCUMENTS

| | | |
|---|---|---|
| 5,909,036 A | 6/1999 | Tanaka et al. |
| 6,930,329 B2 | 8/2005 | Koide |
| 7,314,672 B2 | 1/2008 | Kimura |
| 2003/0010993 A1 | 1/2003 | Nakamura et al. |
| 2004/0095977 A1 | 5/2004 | Nakamura et al. |
| 2004/0185643 A1 | 9/2004 | Chiyo et al. |
| 2006/0006399 A1 | 1/2006 | Nakamura et al. |
| 2007/0148923 A1* | 6/2007 | Kim et al. ..................... 438/518 |

* cited by examiner

*Primary Examiner* — Long K Tran

(74) *Attorney, Agent, or Firm* — Birch, Stewart, Kolasch & Birch, LLP

(57) ABSTRACT

A P-type nitride semiconductor and a method for manufacturing the same are provided. A nitride semiconductor includes a P-type nitride layer formed on a active layer, wherein the P-type nitride layer is a P-type nitride layer with the group 4 element doped.

12 Claims, 3 Drawing Sheets

NITRIDE SEMICONDUCTOR AND METHOD FOR MANUFACTURING THEREOF

The present application is a 37 C.F.R. §1.53(b) continuation of U.S. patent application Ser. No. 11/542,940 filed Oct. 5, 2006 now U.S. Pat. No. 7,834,343, which claims priority on Korea Patent Application No. 10-2005-0093778, filed Oct. 6, 2005, the entire contents of which are hereby incorporated by reference.

BACKGROUND OF THE INVENTION

1. Field of the Invention

The present invention relates to a nitride semiconductor and a method for manufacturing the same.

2. Description of the Related Art

A GaN group nitride semiconductor is one of widely known nitride semiconductors according to the related art. The GaN group nitride semiconductors have been used in a high speed switch or a high power device such as a blue or a green light emitting diode (LED), a metal semiconductor FET (MESFET) and a high electron mobility transistor (HEMT).

Such a GaN group nitride semiconductor according to the related art is generally grown on a sapphire substrate. Then, a polycrystalline thin film is grown on the sapphire substrate at a low temperature as a buffer layer. After forming the buffer layer, an un-doped GaN layer and a Si doped n-GaN layer are sequentially formed on the buffer layer at a high temperature.

Then, the n-GaN layer functions as a first electrode contact layer, and a magnesium doped P-GaN layer is formed on the first electrode contact layer as a second electrode contact layer so as to manufacture the GaN group nitride semiconductor.

Especially, in the field of a light emitting device such as a light emitting diode and a semiconductor laser diode among the application fields of the GaN group nitride semiconductor according to the related art, a P-type nitride semiconductor emitting a blue light has been receiving attention. The P-type nitride semiconductor is a GaN group nitride semiconductor with the group 2 elements such as magnesium or zinc disposed on the location of the group 3 elements Ga.

In order to manufacture the P-type nitride semiconductor among the GaN group nitride semiconductors according to the related art as shown in FIG. 1, a doping method is performed to arrange the group 2 element such as magnesium on the location of the group 3 element such as Ga. The arranged group 2 element, magnesium, is coupled with adjacent atoms so as to generate a hole. The generated hole functions as an acceptor.

However, it is very difficult for the P-type nitride semiconductor according to the related art to have high conductivity because the magnesium is combined with hydrogen H. Therefore, a thermal annealing process is additionally required to separate the coupling of the magnesium and the hydrogen according to the related art.

According to the related art, only about 1% of the doped magnesium functions as the acceptor. That is, about 99% of the doped magnesium is remained inside the semiconductor crystalline layer after combined with the hydrogen. It degrades the crystallinity thereof.

SUMMARY OF THE INVENTION

Accordingly, the present invention provides a semiconductor and a method for manufacturing the same that substantially obviates one or more problems due to limitations and disadvantages of the related art.

The present invention provides a nitride semiconductor having an improved conductivity and crystallinity, and a method for manufacturing the same.

The present invention provides a nitride semiconductor for improving reliability and power loss, and a method for manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

The embodiment of the invention provides a nitride semiconductor including: at least a P-type nitride layer formed on a active layer, wherein the P-type nitride layer is a P-type nitride layer with the group 4 element doped.

Also, the embodiment of the present invention provides a nitride semiconductor including: a buffer layer formed on a substrate; an under layer formed on the buffer layer; an active layer formed on the under layer for emitting light; at least a P-type nitride layer doped with a group 4 element and formed on the active layer.

The embodiment of the present invention provides a method for manufacturing a nitride semiconductor including: growing a nitride layer not doped with a dopant on a substrate; forming a nitrogen lattice layer having a plurality of vacancies on the nitride layer; filling the vacancies of the nitrogen lattice layer with the group 4 element; and removing the residual group four element.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

In specification, the term, 'on' represents that an element is contacted directly or indirectly to another element.

Hereinafter, a P-type nitride semiconductor according to an embodiment of the present invention will be described with reference to accompanying drawings.

A P-type GaN group nitride semiconductor according to an embodiment of the present invention will be described using a GaN group nitride semiconductor as an example. However, the present invention is not limited thereby. The present invention can be applied to other nitride semiconductors to improve the P-type conductivity.

Figure 1:
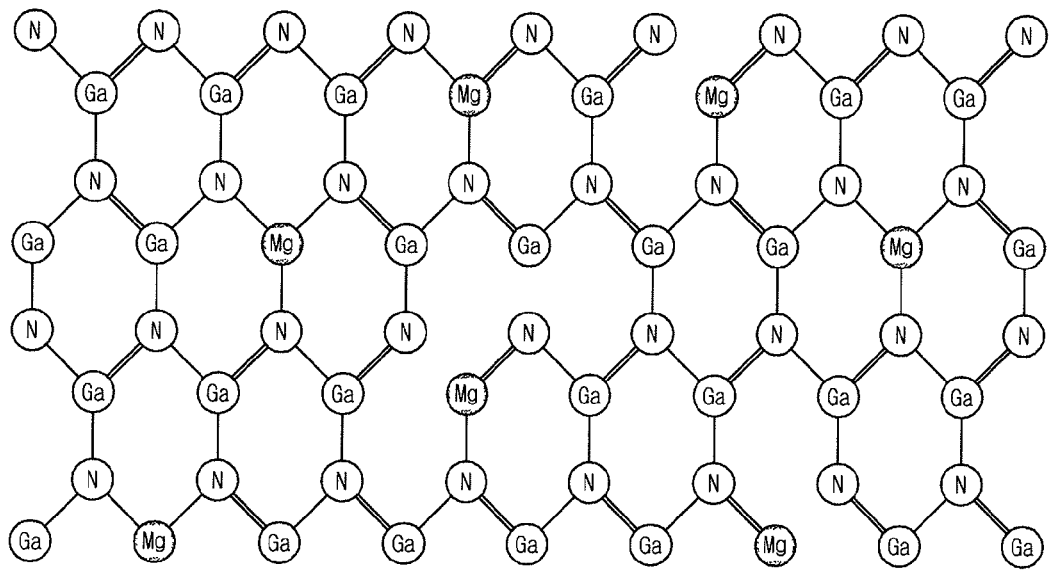
FIG. 1 is a view of a nitride semiconductor at atomic level according to the related art.
Figure 2:
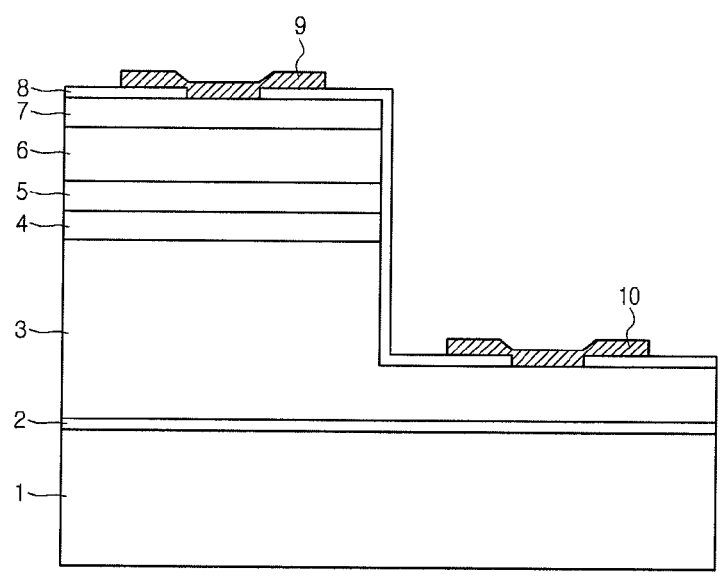
FIG. 2 is a cross-sectional view of a nitride semiconductor according to an embodiment of the present invention.

As a representative example of applying a nitride semiconductor according to the present embodiment, a semiconductor light emitting device having a multi-Quantum well is shown in FIG. 2. Such a semiconductor light emitting device is formed by sequentially stacking a buffer layer 2 made of AlN and GaN, and a GaN under layer 3 as a conductive layer.

An active layer 4 for emitting light is formed on the GaN under layer 3, and P-type nitride semiconductor layers 5, 6 and 7 are formed on the active layer 4, sequentially.

The P-type nitride semiconductor layers 5, 6 and 7 are manufactured by a method for manufacturing a P-type nitride semiconductor according to the present embodiment.

In the related art, the group 2 element such as Mg is doped and placed at the location of Ga which is the group 3 element in order to form the P-type nitride semiconductor layer providing the P-type conductivity. In the present embodiment, the P-type nitride semiconductor is formed by placing the group 4 element, for example, Si, at the location of the group 5 element, for example, nitrogen, as amphoteric dopant.

In the present embodiment, the P-type nitride semiconductor is manufactured using Si as the group 4 element. However, the present invention is not limited thereby. That is, the P-type conductivity may be embodied by stacking other group 4 elements such as C, Ge, or Sn with N instead of Si.

Hereinafter, a method of forming P-type nitride semiconductor layers 5, 6 and 7 using Si through atomic layer deposition (ALD) according to an embodiment of the present invention will be described.

The ALD absorbs molecules at the surface of the semiconductor layer and substitutes the absorbed molecules. That is, the ALD alternatively performs the absorbing operation and the substituting operation. Therefore, layer-by-layer deposition is allowed, and an oxidation layer and a metal thin film can be formed to be extremely thin. Also, the ALD is suitable to manufacture a system-on-chip (SoC) because the ALD can form a superior layer at a low temperature, for example, lower than about 500° C.

At first, a sapphire substrate 1 is installed at an ALD chamber (not shown). Then, a buffer layer 2 made of AlN and GaN is grown on the sapphire substrate 1 at a low temperature. Afterward, a GaN under layer 3 having an n-type conductivity is formed on the buffer layer 2 at a predetermined thickness by injecting trimethylgallium (TMG), ammonia, and methylsilan.

Then, an active layer 4 is formed on the GaN under layer 3 for emitting light. For example, an active layer 4 made of $In_xGa_{1-x}N$, where $0 \leq X \leq 0.37$, is formed by injecting TMGa, TMIn, $SiH_4$ and $Si_2H_6$ at $N_2$, $H_2+N_2$ carrier gases and ammonia gas atmosphere. The active layer 4 may be formed at, for example, thickness of about 10 to 30 Å or about 50 to 250 Å.

In order to sequentially stack P-type nitride semiconductor layers 5, 6 and 7 having P-type conductivity on the active layer 4, a P-type nitride semiconductor layer is formed using Si according to the manufacturing method of the present embodiment. In the present embodiment, the P-type nitride semiconductor layer is formed by arranging Si, which is the group 4 element, on the location of Ni as the amphoteric dopant.

Figure 3A:
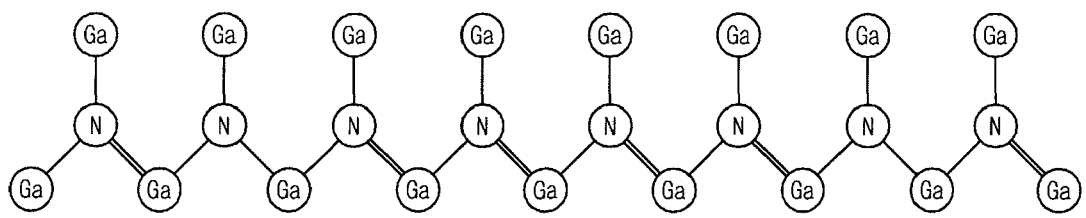
FIGS. 3A to 3C are views of a nitride semiconductor at an atomic level for describing a method of manufacturing a P-type nitride semiconductor according to an embodiment of the present invention.

At first, an undoped GaN layer is formed at thinner than 300 Å by supplying TMGa and $NH_3$ sequentially into the chamber with the temperature thereof sustained at about 700° C., as shown in FIG. 3A.

Figure 3B:
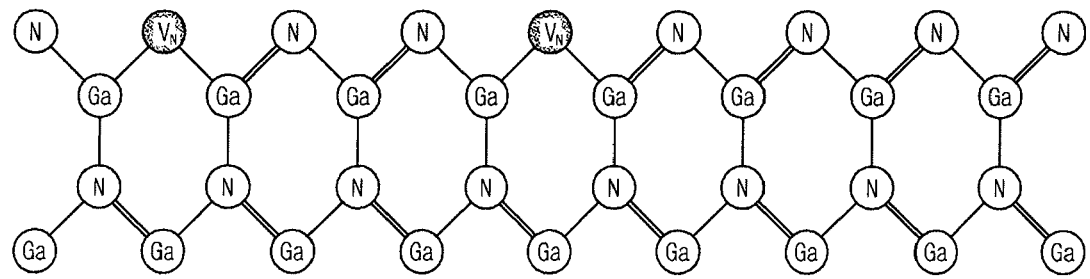

As shown in FIG. 3B, small amount of $NH_3$, for example, about smaller than 1 slm, is injected to the chamber with the temperature of the chamber lowered than about 700° C., preferably, about 500° C. Then, TMGa and $NH_3$ are sequentially injected to the chamber to form a plurality of vacancies $V_N$ on an N layer.

Figure 3C:
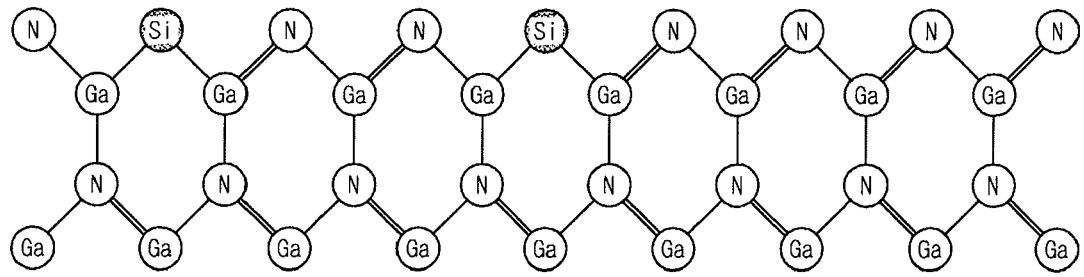

As shown in FIG. 3C, a silan gas having Si is injected to the chamber at about 500° C. after removing the gas from the chamber.

Then, Si atoms, not combined to the vacancies $V_N$ of the N layer, are removed by increasing the temperature of the chamber at about higher than 700° C.

Figure 4:
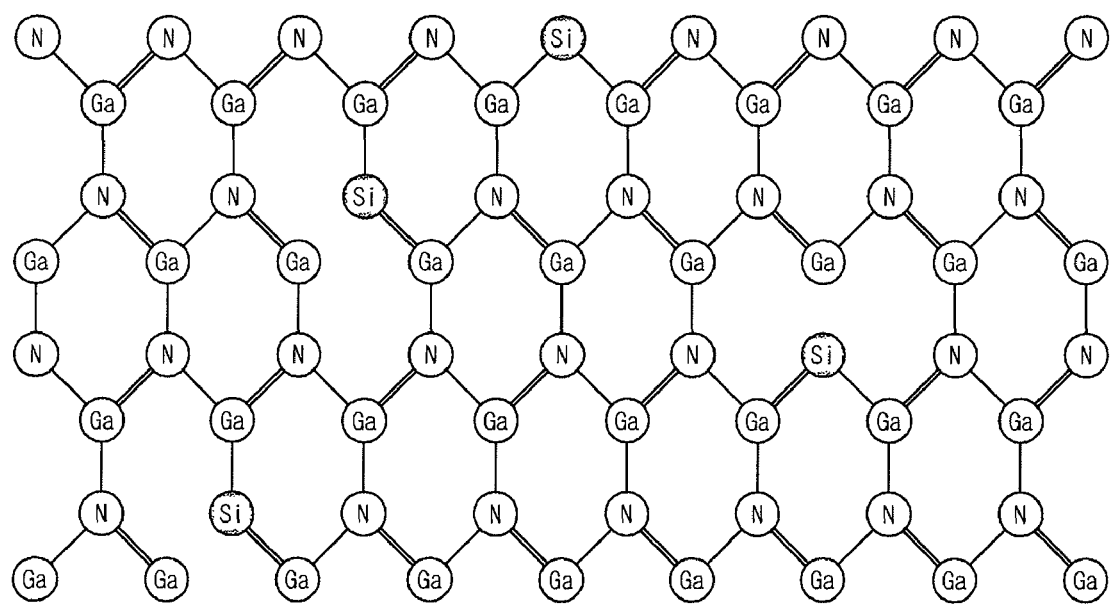
FIG. 4 is a view of a nitride semiconductor at an atomic level according to an embodiment of the present invention.

A GaN layer having a plurality of iterative Si doped lattice layers is formed by performing repeatedly the above described operations, as shown FIG. 4. As a result, the group 4 element Si is placed at the location of the group 5 element N, and holes are generated by Si in combining with other atoms. Such holes function as acceptors so as to have the P-type conductivity.

In more detail, if the group 2 element Mg is used as like the related art, the high conductivity cannot be provided because Mg is combined with H in a carrier gas. In the present embodiment, the group 4 element Si is used. Therefore, sufficient amount of holes are generated because Si is not combined with H in the carrier gas. That is, Si functions as an acceptor with superior conductivity.

The lattice constant of Mg is about 4.21 Å, and the lattice constant of Si is about 5.43 Å. In the related art, dislocation problem is arisen in epitaxial growth due to the lattice constant difference between Mg and peripheral atoms. However, in the present invention, Si is used instead of Mg, the dislocation program can be significantly overcome.

The P-type nitride semiconductor is manufactured by forming an insulating layer 8, a P-electrode 9 and an N-electrode 10 on the stacked nitride semiconductor layers 5, 6 and 7.

As described above, in the method of forming the P-type semiconductor layers 5, 6 and 7 according to the present embodiment, supplying Ga source, supplying N source and generating N vacancies, supplying Si source, and supplying Ga source are performed in sequence.

However, the method of forming the P-type semiconductor layers 5, 6 and 7 according to the present invention is not limited thereby. For example, the P-type semiconductor layers 5, 6, and 7 may be formed by sequentially performing supplying Ga source, supplying N source and generating N vacancies, supplying N and Si source at the same time, and supplying Ga source as another embodiment.

Also, the P-type semiconductor layers 5, 6, and 7 may be formed by sequentially performing supplying Ga source, supplying Mg source, supplying N source and generating N vacancies, supplying Si source, and supplying Ga source as further another embodiment.

As described above, the nitride semiconductor and the method of manufacturing the same according to the present invention arranges the group 4 element Si on the location of the group 5 element N instead of arranging the group 2 element Mg on the location of the group 3 element Ga. That is, the group 4 element Si is used as the P-type dopant. Therefore, the epitaxial layer can be formed with minimum dislocation according to the present invention, and thus the dislocation program caused by the lattice constant difference can be overcome by the present invention.

Also, the nitride semiconductor having the improved conductivity can be manufactured by doping the group 4 element which is not combined with H according to the present invention.

A P-type GaN group nitride semiconductor according to an embodiment of the present invention is described using an atomic layer deposition (ALD). However, the present invention is not limited thereby. For example, the P-type GaN group nitride semiconductor according to another embodiment of the present invention can be manufactured using a metal organic chemical vapor deposition (MOCVD).

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A nitride semiconductor, comprising:
   a P-type nitride layer formed on an active layer,
   wherein the P-type nitride layer comprises a group 4 element,
   wherein the group 4 element is not substantially combined with hydrogen (H),
   wherein the group 4 element is an element selected from the group consisting of silicon (Si), carbon (C), and germanium (Ge), and
   wherein the group 4 element is at least partially doped at one or more nitrogen vacancies of the P-type nitride layer.

2. The nitride semiconductor according to claim 1, further comprising:
   a substrate; and
   a nitride layer that is not doped with dopant and that is formed on the substrate,
   wherein the P-type nitride layer is formed on the nitride layer.

3. The nitride semiconductor according to claim 1, wherein the group 4 element functions as an acceptor.

4. The nitride semiconductor according to claim 1, further comprising:
   a nitrogen lattice layer having a plurality of vacancies.

5. The nitride semiconductor according to claim 4, wherein the group of 4 element fills at least one vacancy of the nitrogen lattice layer.

6. A nitride semiconductor, comprising:
   a buffer layer formed on a substrate;
   an under layer formed on the buffer layer;
   an active layer formed on the under layer for emitting light;
   a P-type nitride layer comprising a group 4 element on the active layer,
   wherein the group 4 element is not substantially combined with hydrogen (H),
   wherein the group 4 element is an element selected from the group consisting of silicon (Si), carbon (C), and germanium (Ge), and
   wherein the group 4 element is at least partially doped at one or more nitrogen vacancies of the P-type nitride layer.

7. The nitride semiconductor according to claim 6, further comprising:
   an insulating layer arranged to expose a predetermined portion of the P-type nitride layer and a predetermined portion of the under layer;
   a P-electrode in contact with the exposed P-type nitride layer and formed at a predetermined portion of the insulating layer; and
   an N-electrode in contact with the exposed under layer and formed at a predetermined portion of the insulating layer.

8. The nitride semiconductor according to claim 6, wherein the group 4 element functions as an acceptor.

9. The nitride semiconductor according to claim 6, further comprising:
   a nitrogen lattice layer having a plurality of vacancies.

10. The nitride semiconductor according to claim 9, wherein the group of 4 element fills at least one vacancy of the nitrogen lattice layer.

11. A nitride semiconductor, comprising:
    a conductive substrate;
    a N-type semiconductor layer on the conductive substrate;
    an active layer on the N type semiconductor layer; and
    a P-type semiconductor layer on the active layer,
    wherein the P-type semiconductor layer comprises at least one group 4 element,
    wherein the group 4 element is not substantially combined with hydrogen (H),
    wherein the group 4 element is an element selected from the group consisting of silicon (Si), carbon (C), and germanium (Ge), and
    wherein the group 4 element is at least partially doped at one or more nitrogen vacancies of the P-type semiconductor layer.

12. The nitride semiconductor according to claim 11, wherein the P-type semiconductor layer is a P-type nitride layer.

* * * * *